(12) United States Patent
Takata

(10) Patent No.: US 8,097,965 B2
(45) Date of Patent: Jan. 17, 2012

(54) SEMICONDUCTOR DEVICE AND METHOD OF MANUFACTURING THE SAME

(75) Inventor: Takashi Takata, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/336,043

(22) Filed: Dec. 16, 2008

(65) Prior Publication Data

US 2009/0179304 A1 Jul. 16, 2009

(30) Foreign Application Priority Data

Jan. 11, 2008 (JP) ................. 2008-003766

(51) Int. Cl.
*H01L 23/28* (2006.01)
(52) U.S. Cl. ....................... 257/787; 257/798
(58) Field of Classification Search ............... 257/797, 257/787, 680, 679, 798
See application file for complete search history.

(56) References Cited

U.S. PATENT DOCUMENTS

| | | | | |
|---|---|---|---|---|
| 5,562,993 | A * | 10/1996 | Hotta | 428/458 |
| 6,187,614 | B1 | 2/2001 | Takata et al. | 438/112 |
| 6,621,153 | B2 * | 9/2003 | Kawai et al. | 257/679 |
| 6,797,544 | B2 * | 9/2004 | Sakai et al. | 438/121 |
| 7,364,945 | B2 * | 4/2008 | Shim et al. | 438/109 |
| 2001/0033018 | A1 | 10/2001 | Kimura | 257/730 |
| 2002/0039811 | A1 | 4/2002 | Fujisawa | 438/127 |
| 2003/0080440 | A1 * | 5/2003 | Miks et al. | 257/787 |
| 2005/0067719 | A1 * | 3/2005 | Hayashi et al. | 257/787 |
| 2005/0280126 | A1 * | 12/2005 | Joshi et al. | 257/676 |
| 2009/0230569 | A1 * | 9/2009 | Donis et al. | 257/787 |
| 2010/0264532 | A1 * | 10/2010 | Bolken et al. | 257/680 |

FOREIGN PATENT DOCUMENTS

JP 2002-50720 2/2002

* cited by examiner

*Primary Examiner* — S. V Clark
(74) *Attorney, Agent, or Firm* — Steptoe & Johnson, LLP

(57) ABSTRACT

In the manufacture of semiconductor devices, cracking of a resin member caused during cutting and defects in the external appearance are prevented.

14 Claims, 15 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and in particular the technique of suppressing the occurrence of cracking during dicing.

2. Description of the Related Art

A method of manufacture of semiconductor devices of the prior art is for example described in Japanese Patent No. 3639509. Here, a plurality of semiconductor elements are arranged on a substrate at prescribed intervals, a resin member is formed so as to cover the plurality of semiconductor elements, and the resin member and substrate are cut between the adjacent semiconductor elements.

In such a manufacturing method, in order to divide the resin member and substrate into individual dice each comprising a semiconductor element region, a dicing blade is used to cut away the resin member and substrate. As a result, the resin member may crack near where the dicing blade passes through.

If the cracked portion is small, there are no major problems in use. However, when large internal stresses accumulate in the resin member due to a resin curing reaction, heat, or other factors, passage of the dicing blade may cause substantial cracking of the resin member. As a result, the external appearance is worsened, and in some cases an adequate thickness of the resin member to cover the semiconductor elements cannot be secured, resulting in defective units.

SUMMARY OF THE INVENTION

Hence an object of this invention is to provide a semiconductor device and a method of manufacturing the same whereby the occurrence of defective units is reduced.

In order to resolve the above problem, a semiconductor device of this invention comprises a substrate, a semiconductor element mounted on a mounting face that forms the main face of the substrate, and a resin member formed on the main face of the substrate and covering the semiconductor element, and the semiconductor device has a continuous depression portion or an intermittent depression portion on an edge portion of the outside surface forming the main face of the resin member.

According to the invention, when cutting the resin member and substrate during manufacture of semiconductor devices, accumulated stresses in the resin member are reduced, and moreover cracks caused in the surface of the resin member due to the cutting are easily interrupted at the depression portions, so that cracking of the resin member in the region inside the depression portions can be suppressed, and the occurrence of defective units can be reduced.

DESCRIPTION OF THE PREFERRED EMBODIMENTS

Figure 1:
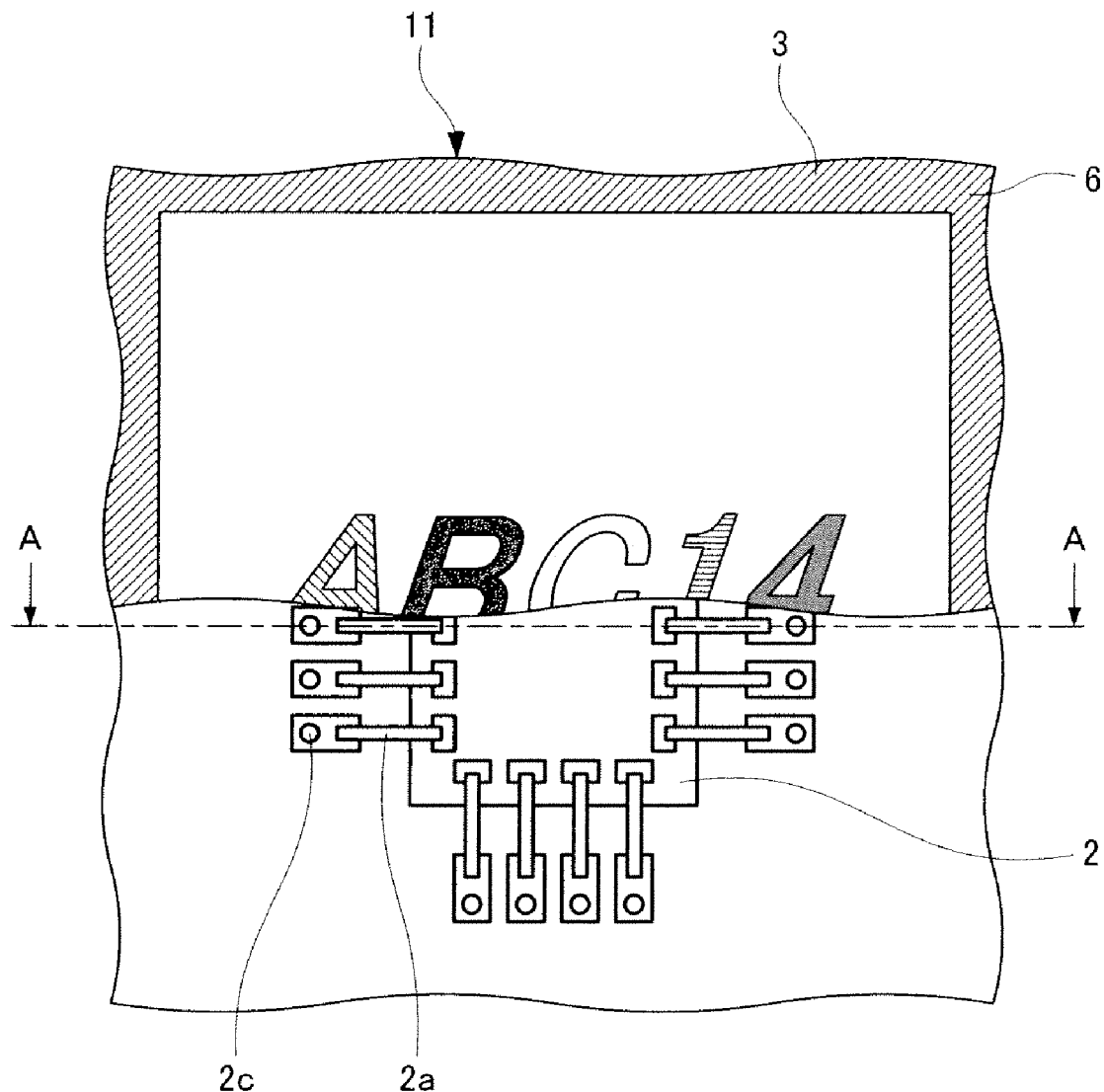
FIG. 1 is a plane view of a semiconductor device in Embodiment 1 of the invention.

Below, aspects of semiconductor devices of the invention are explained.

A semiconductor device of a first aspect comprises a substrate, a semiconductor element mounted on a mounting face that forms the main face of the substrate, and a resin member formed on the main face of the substrate and covering the semiconductor element, and the semiconductor device has a continuous depression portion on edge portions of the outside surface forming the main face of the resin member.

By this means, cracking of the resin member in the region inside the depression portion can be suppressed.

A semiconductor device of a second aspect comprises a substrate, a semiconductor element mounted on a mounting face that forms the main face of the substrate, and a resin member formed on the main face of the substrate and covering the semiconductor element, and the semiconductor device has an intermittent depression portion on edge portions of the outside surface forming the main face of the resin member.

By this means, cracking of the resin member in the region on the inside of the depression portion can be suppressed.

A semiconductor device of a third aspect displays depression-shape symbols on the outside surface forming the main face of the resin member.

By this means, a device for displaying symbols on semiconductor devices can be used to form the depression portions.

A semiconductor device of a fourth aspect displays the depression-shape symbols and the depression portions using the same color on the outside surface forming the main face of the resin member.

By this means, a device for displaying symbols on semiconductor devices can be used to form the depression portions.

A semiconductor device of a fifth aspect has the depression portion whose surface color is white. By this means, a laser can be used as the device for forming the depression portion. Moreover, because if the resin member cracks in the depression portion the color below the depression portion appears, cracked portions can be visually identified. Hence if a crack in the resin member extends to the region inside the depression portion, the white line (depression portion) is interrupted, so that cracking of the resin member extending into the region inside the depression portion can easily be identified, and a judgment as to whether external appearance is defective is possible.

A semiconductor device of a sixth aspect has the continuous depression portion formed over the entire periphery of the edge portion of the outside surface forming the main face of the resin member.

By this means, cracking of the resin member extending to inside the depression portion can easily be identified, and a judgment as to whether the external appearance is defective can be made.

A semiconductor device of a seventh aspect has the intermittent depression portion formed over the entire periphery of the edge portion of the outside surface forming the main face of the resin member.

By this means, cracking of the resin member extending to inside the depression portion can easily be identified, and a judgment as to whether the external appearance is defective can be made.

A semiconductor device manufacturing method of an eighth aspect comprises arranging a plurality of semiconductor elements, in a plane at prescribed intervals, on a mounting face that forms the main face of a substrate; forming a resin member covering the semiconductor elements on the main face of the substrate; forming a continuous depression portion in the outside surface forming the main face of the resin member between the adjacent semiconductor elements, along both sides of the portions to be cut; and cutting the substrate and the resin member along the portions to be cut.

A semiconductor device manufacturing method of a ninth aspect comprises arranging a plurality of semiconductor elements, in a plane at prescribed intervals, on a mounting face that forms the main face of a substrate; forming a resin member covering the semiconductor elements on the main face of the substrate; forming an intermittent depression portion in the outside surface forming the main face of the resin member between the adjacent semiconductor elements, along both sides of the portions to be cut; and cutting the substrate and the resin member along the portions to be cut.

A semiconductor device manufacturing method of a tenth aspect uses the same means as the means used to form the depression portion, to form depression-shape symbols in the outside surface forming the main face of the resin member.

A semiconductor device manufacturing method of an eleventh aspect uses irradiation by a laser beam to form the depression portion.

In a semiconductor device manufacturing method of a twelfth aspect, after forming the depression portion in the outside surface forming the main face of the resin member between the adjacent semiconductor elements, portions to become corners of the resin member after cutting are irradiated by the laser beam to make the portions to become corners lower than the outside surface of the resin member.

In a semiconductor device manufacturing method of a thirteenth aspect, in the process of cutting the substrate and the resin member along the portions to be cut, the cutting is performed by dicing.

In a semiconductor device manufacturing method of a fourteenth aspect, the depression portion is formed by irradiation with a laser beam and the color of the surface of the depression portion is changed, and after cutting the substrate and the resin member along the portions to be cut, when cracking from the depression portion whose color is changed extends to the inside region of the resin member, a judgment is made that a defective unit is manufactured.

Below, embodiments of the invention are explained based on the drawings.

Embodiment 1

Figure 2:
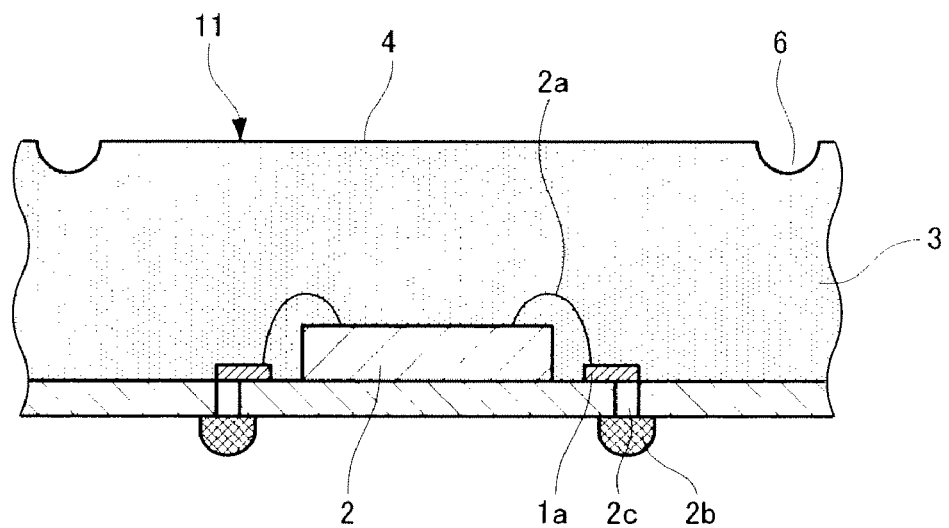
FIG. 2 is a cross-sectional view of the semiconductor device in Embodiment 1 of the invention.
Figure 3:
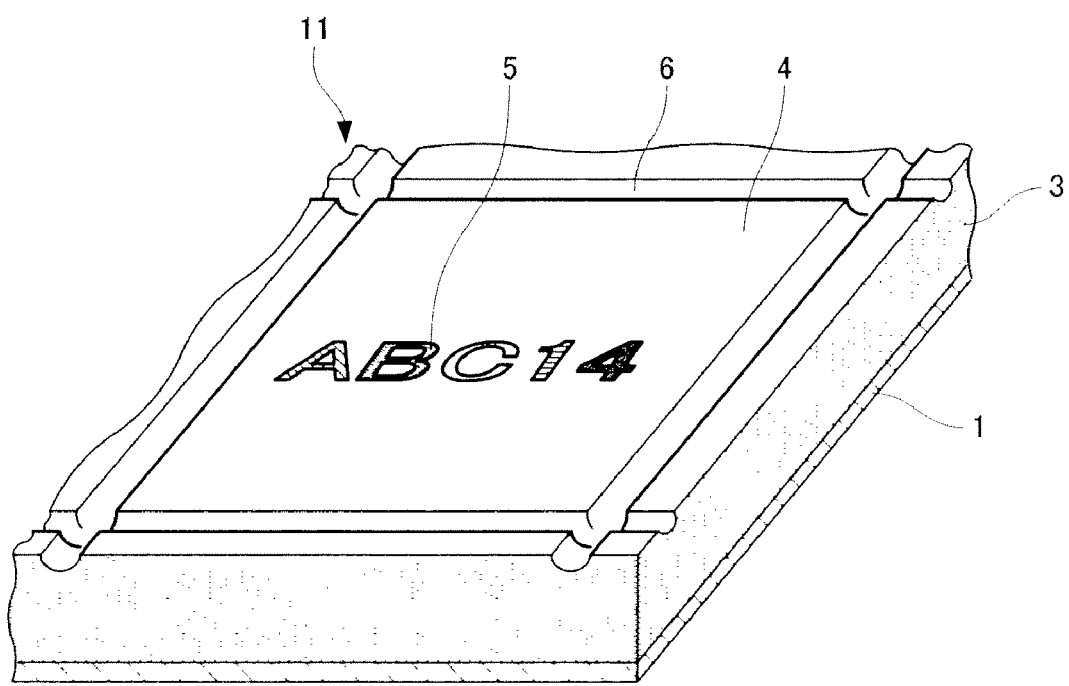
FIG. 3 is a perspective view of the semiconductor device in Embodiment 1 of the invention.

Below, FIG. 1 through FIG. 3 are used to explain a semiconductor device of Embodiment 1 of the invention. FIG. 1 is a plane view of the semiconductor device, FIG. 2 is a cross-sectional view of the semiconductor device, and FIG. 3 is an external view of the semiconductor device.

As shown in FIG. 1 and FIG. 2, in a semiconductor device 11, a semiconductor element 2 is mounted on the mounting face that is the upper face (upper surface) forming the main face of a substrate 1, and wires 2a are used to electrically connect the semiconductor element 2 to electrodes 1a of the substrate 1.

The semiconductor device 11 has external terminals 2b (not shown) for connection to a printed circuit board on the lower face of the substrate 1; the wires 2a and external terminals 2b are connected electrically via through-holes 2c in the substrate 1.

A resin member 3 is formed on the upper face of the substrate 1, covering the semiconductor element 2; the resin member 3 is made of an epoxy resin or other mold resin. As shown in FIG. 3, around the center of an outside surface 4 forming the main face of the resin member 3 is formed a white depression portion forming characters 5, for example, "ABC14"; on the edge portion of the outside surface 4 of the resin member 3 is formed a white continuous depression portion 6.

Figure 4:
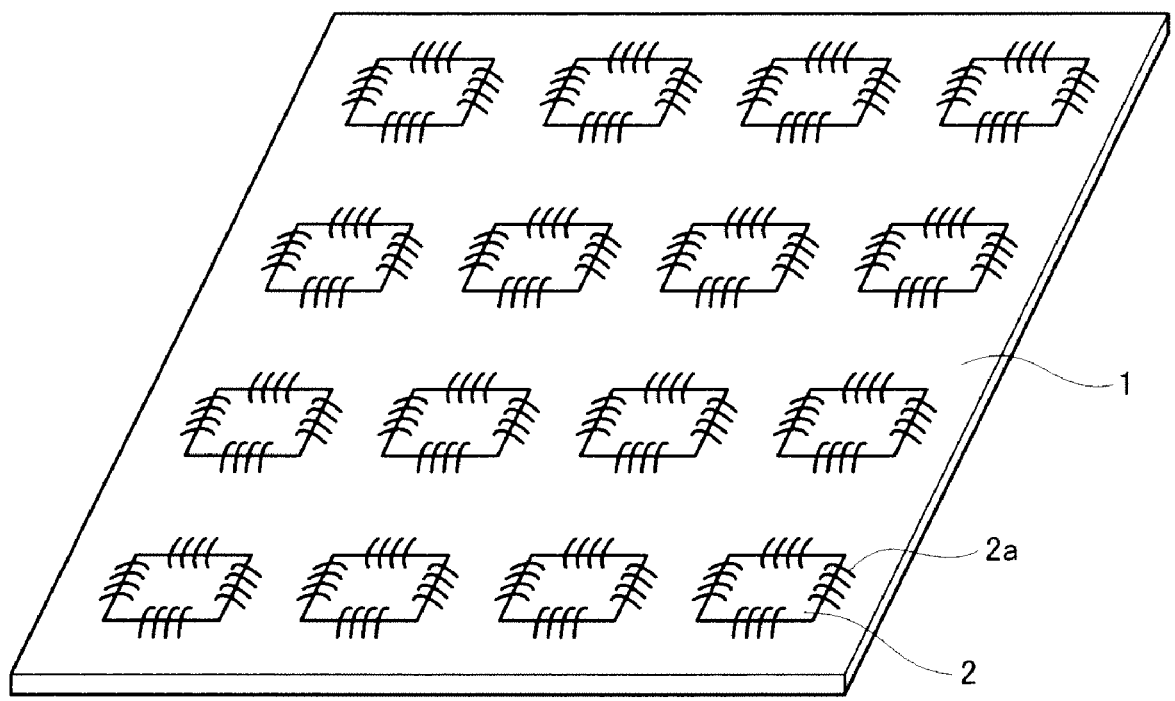
FIG. 4 is a perspective view of a first step in a method of manufacture of a semiconductor device in Embodiment 1 of the invention.

Next, FIG. 4 through FIG. 10 are used to explain a method of manufacturing the semiconductor device 11, a case in which sixteen semiconductor devices are manufactured. As shown in FIG. 4, sixteen semiconductor elements 2 are arranged in a plane at prescribed intervals on the substrate 1, and the terminals of the semiconductor elements 2 and the substrate 1 are electrically connected by the wires 2a.

Figure 5:
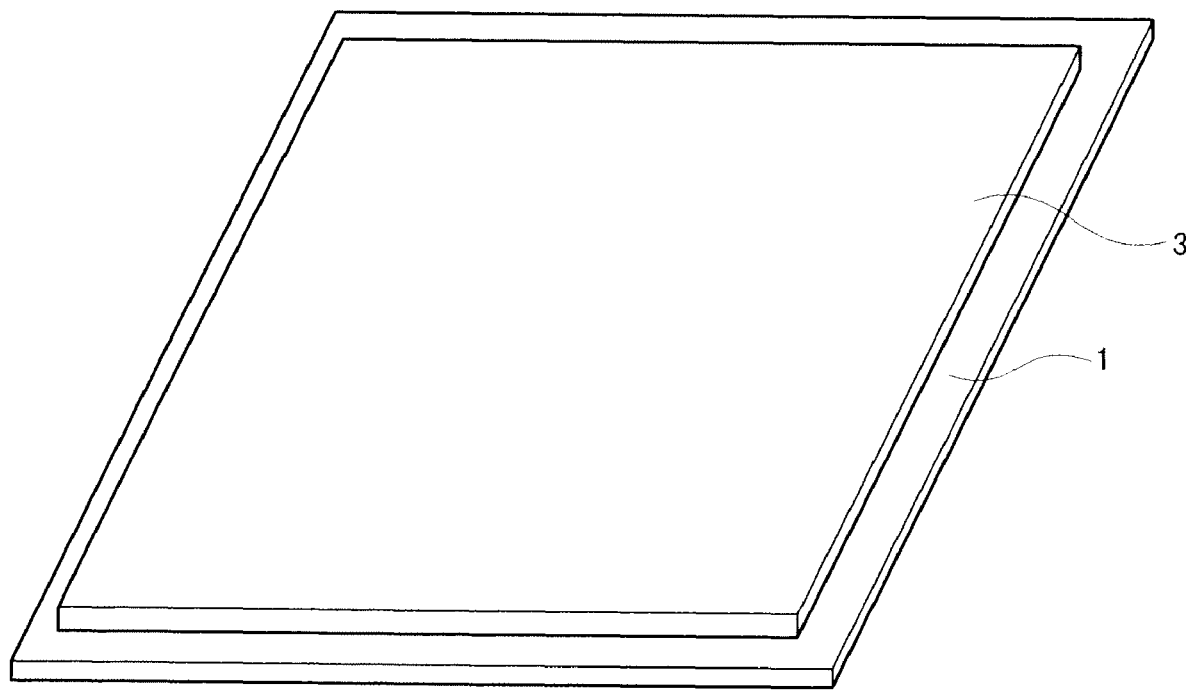
FIG. 5 is a perspective view of a second step in the method of manufacture of a semiconductor device in Embodiment 1 of the invention.

Then, as shown in FIG. 5, the resin member 3 made of a mold resin such as an epoxy resin is formed in a rectangular shape, covering all of the semiconductor elements 2.

Figure 6:
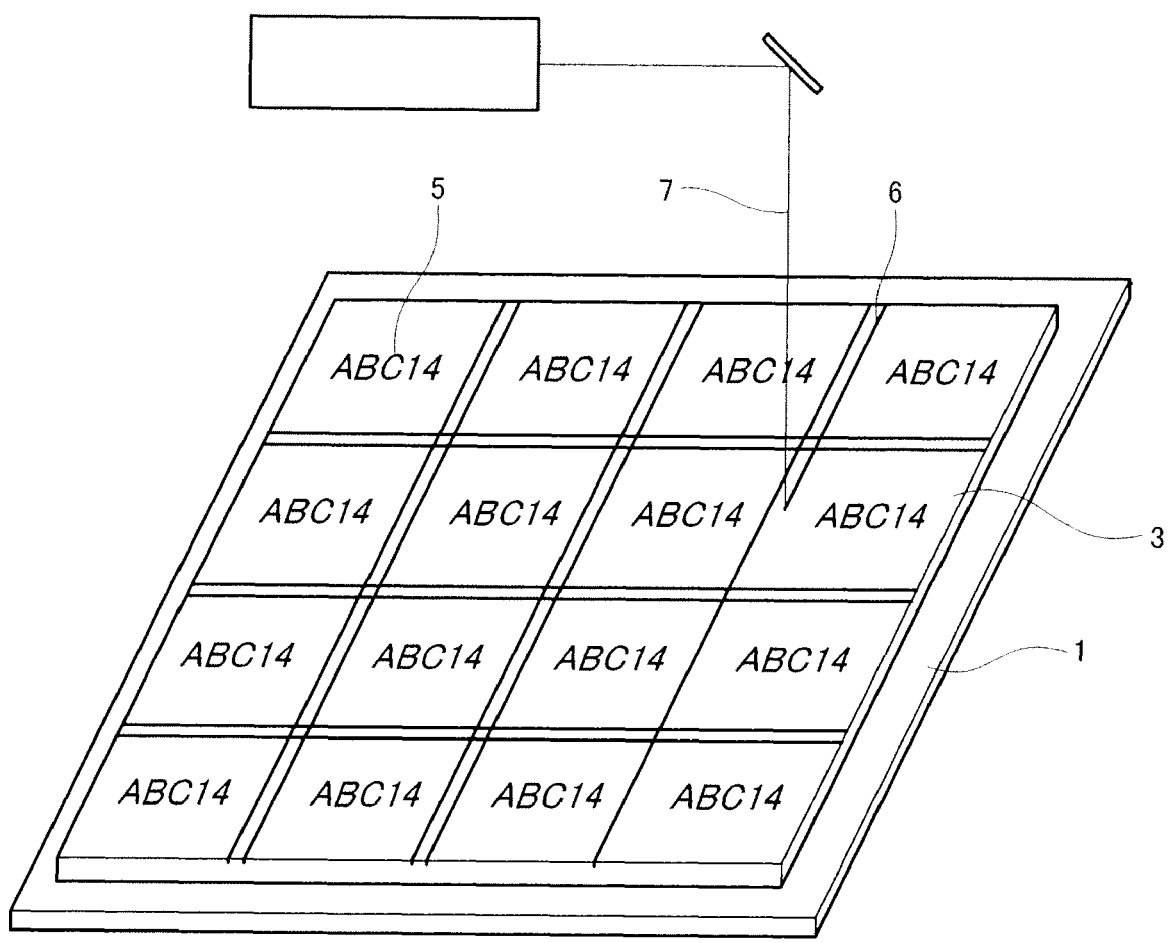
FIG. 6 is a perspective view of a third step in the method of manufacture of a semiconductor device in Embodiment 1 of the invention.

Next, as shown in FIG. 6, by irradiating the outside surface 4 forming the main face of the resin member 3 with a laser beam 7, a part number is displayed on the semiconductor device 11; the characters 5, for example, "ABC14" are formed. The characters 5 form a depression shape, the surface of which is white.

And, by irradiating the portions to be cut on the outside surface 4 of the resin member 3 between the adjacent semiconductor devices 2 with the laser beam 7, the white continuous depression portion 6 is formed close to and along both sides of the region to be cut in the subsequent dicing process.

Figure 7:
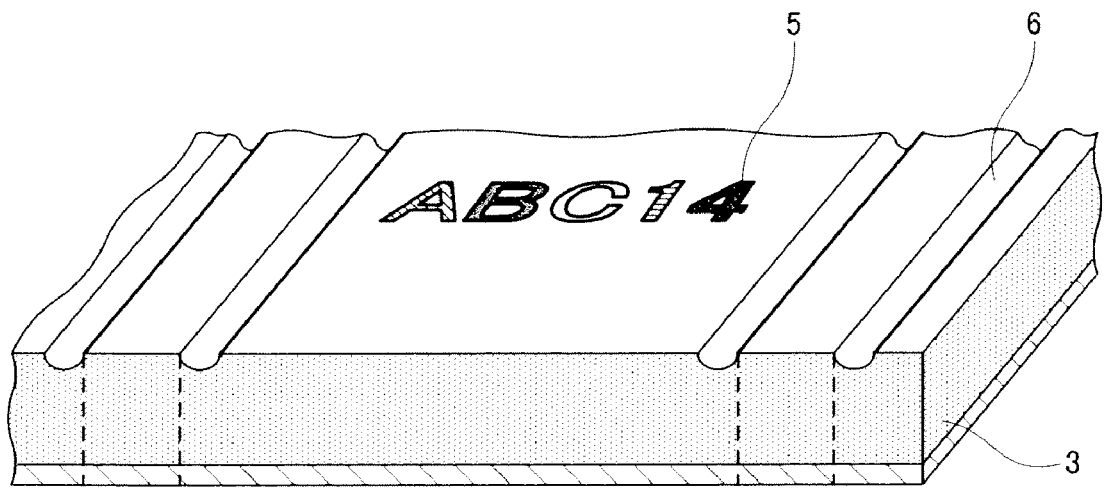
FIG. 7 is a partial enlarged perspective view of a process in the method of manufacture of a semiconductor device in Embodiment 1 of the invention.

FIG. 7 is a partial expanded view of the resin member 3 after irradiation by the laser beam 7. The characters 5 and continuous depression portion 6 formed in the resin member 3 through irradiation by the laser beam 7 appear white, due to diffuse reflection of light in the tracks of the laser beam 7 on the surface. That is, in these portions the surface has a white color.

Figure 8:
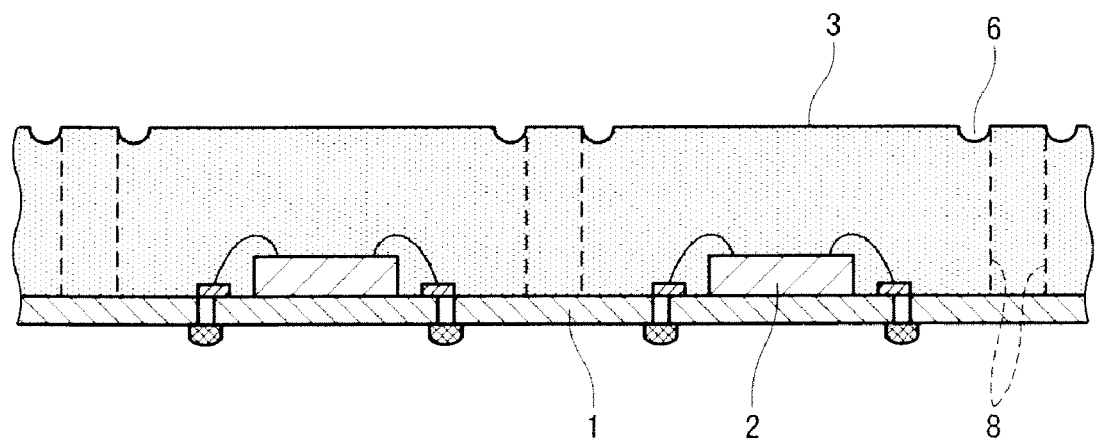
FIG. 8 is a partial enlarged perspective view of a process in the method of manufacture of a semiconductor device in Embodiment 1 of the invention.

FIG. 8 is a partial cross-sectional view of semiconductor devices after irradiation with the laser beam 7, and before division. The dashed lines in the figure indicate boundaries 8 of portions that are to be cut by dicing (hereafter called "dicing regions").

The continuous depression portions 6 are formed along both sides of the dicing regions, and are positioned with the center portion, which is the deepest area of the depression portion 6, shifted slightly to the region on the inside of the boundaries 8 of the dicing regions. Hence the depression portions 6 are positioned on the outside surface 4 of the resin member 3 forming the region of the semiconductor device 11, and an opening edge of the depression portion 6 is positioned at the boundary 8 of the dicing region.

Figure 9:
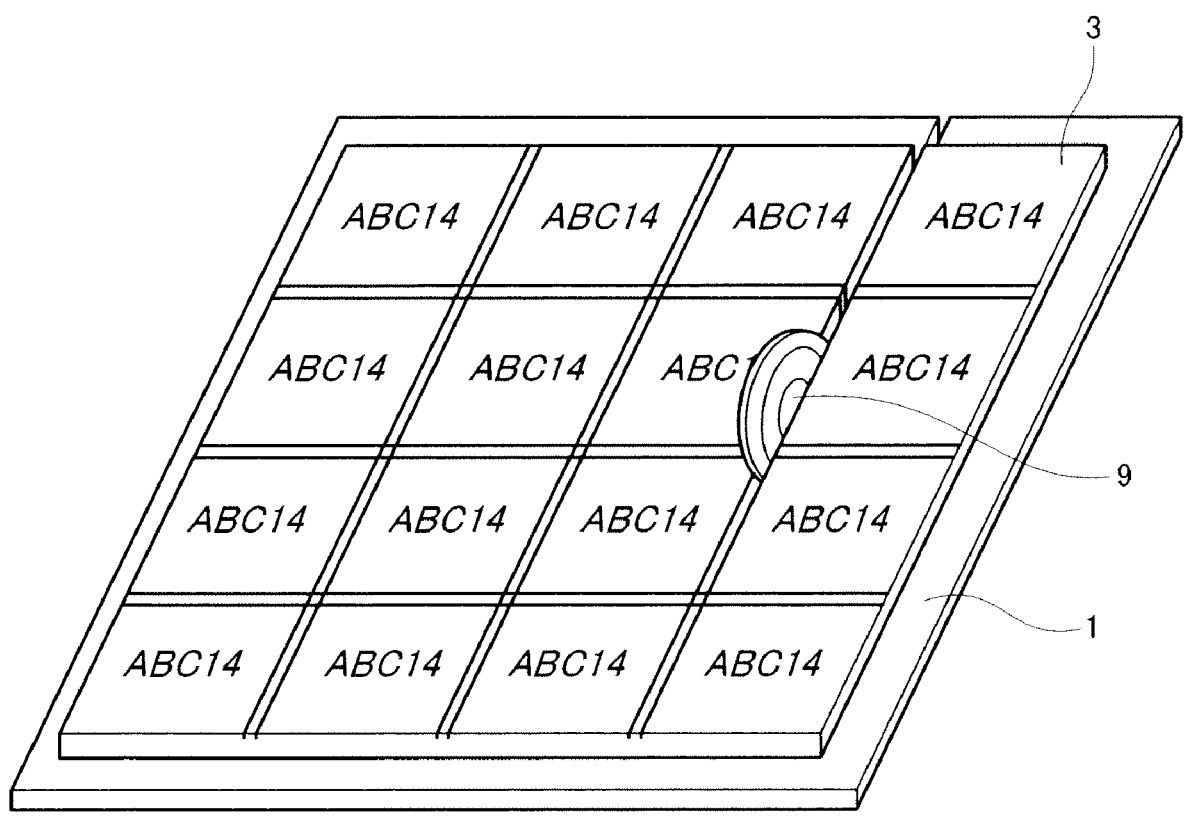
FIG. 9 is a perspective view of a fourth step in the method of manufacture of a semiconductor device in Embodiment 1 of the invention.

Next, as shown in FIG. 9, in the dicing process, the semiconductor devices (before division) that have been irradiated by the laser beam 7 are cut into sixteen dies in the dicing regions using a dicing blade 9.

In general, when dicing is performed, forces act on the resin member 3 in portions other than the portion through which the dicing blade passes, so that cracking of the resin member 3 occurs. However, in this embodiment, for reasons explained below, there is little possibility of cracking in the region on the inside of the continuous depression portion 6.

Figure 10:
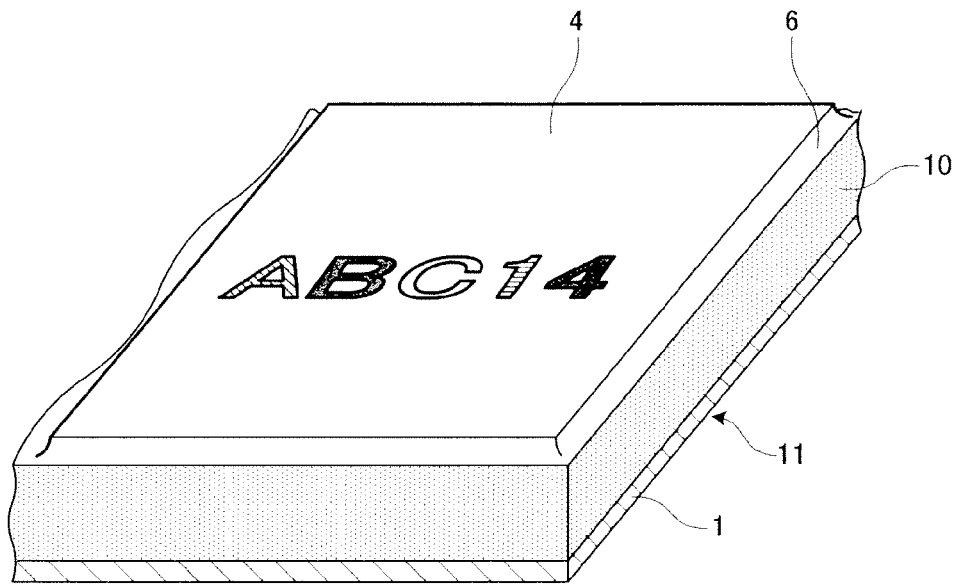
FIG. 10 is a perspective view of a completed unit of the semiconductor device in Embodiment 1 of the invention.

FIG. 10 is an enlarged view showing one semiconductor device 11 after using the dicing blade 9 for division into sixteen dies each comprising the individual semiconductor element 2.

As shown in FIG. 10, a face 10 that has been cut by dicing is not flat, and the edges of the outside surface 4 of the resin member 3, that is, the edge at which the face in contact with the substrate 1 and the opposite-side face meet is not a straight line. During dicing, stresses act on the resin member 3 due to the rotating force of the dicing blade 9, so that cracks may occur in the surface portion of the resin member 3.

However, due to the existence of the continuous depression portion 6 close to and along the dicing region, cracks do not extend into the resin member 3 forming the region of the semiconductor device 11 traversing the continuous depression portion 6, and the possibility of cracking of the resin member 3 forming the region of the semiconductor device 11 is reduced. That is, accumulated stresses within the resin member are reduced during cutting of the resin member 3 and substrate 1 by the dicing blade 9, and cracks occurring in the surface of the resin member 3 arising from cutting are more easily interrupted by the depression portion 6.

In this way, through the existence of the continuous depression portion 6, cracking extending to the resin member 3 forming the region of the semiconductor device 11 on the inside, traversing the depression portion 6, can be suppressed, and the defective appearance of the semiconductor device can also be prevented. Further, by making the thickness of the resin member 3 covering the semiconductor element 2 equal to or greater than a prescribed value, the semiconductor element 2 on the inside of the resin member 3 can be adequately protected, and so there is the advantageous result that performance defects can be prevented.

Further, formation of the continuous depression portion 6 also entails release of strain occurring at the time of formation of the resin member 3, and as a result, flexure of the substrate 1 and resin member 3 prior to cutting can be corrected to facilitate cutting.

Also, a laser beam 7 used in writing unit numbers in the prior art is employed as the means of forming the continuous depression portion 6, so that there is the advantage that modification of manufacturing facilities need not be made.

Figure 11:
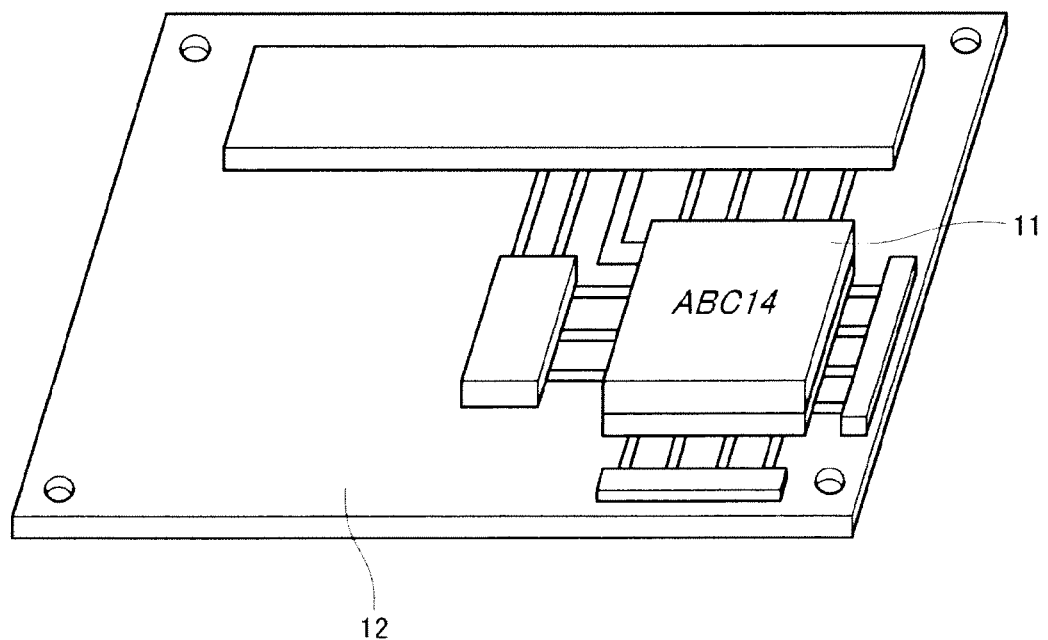
FIG. 11 is a perspective view of an example of use of the completed unit of the semiconductor device in Embodiment 1 of the invention.

The semiconductor device 11 manufactured as described above is as explained in FIG. 1 through FIG. 3. FIG. 11 shows an example of use of the semiconductor device 11 manufactured as explained above. In this semiconductor device 11, terminals are on the lower face, and the device can be mounted electrically by press-fitting onto a printed circuit board 12.

However, the white continuous depression portion 6 is formed using the same laser beam 7 used to form the "ABC14" depression-shape characters 5 for the unit number, but by adjusting the output of the laser beam 7 or other means, the depth can be made the same as that of the characters 5, or can be made a different depth, or can be made an arbitrary depth, and moreover the surface of the depression portion 6 can also be made white. This white continuous depression portion 6 may be used to discriminate between satisfactory and defective semiconductor devices.

Figure 12:
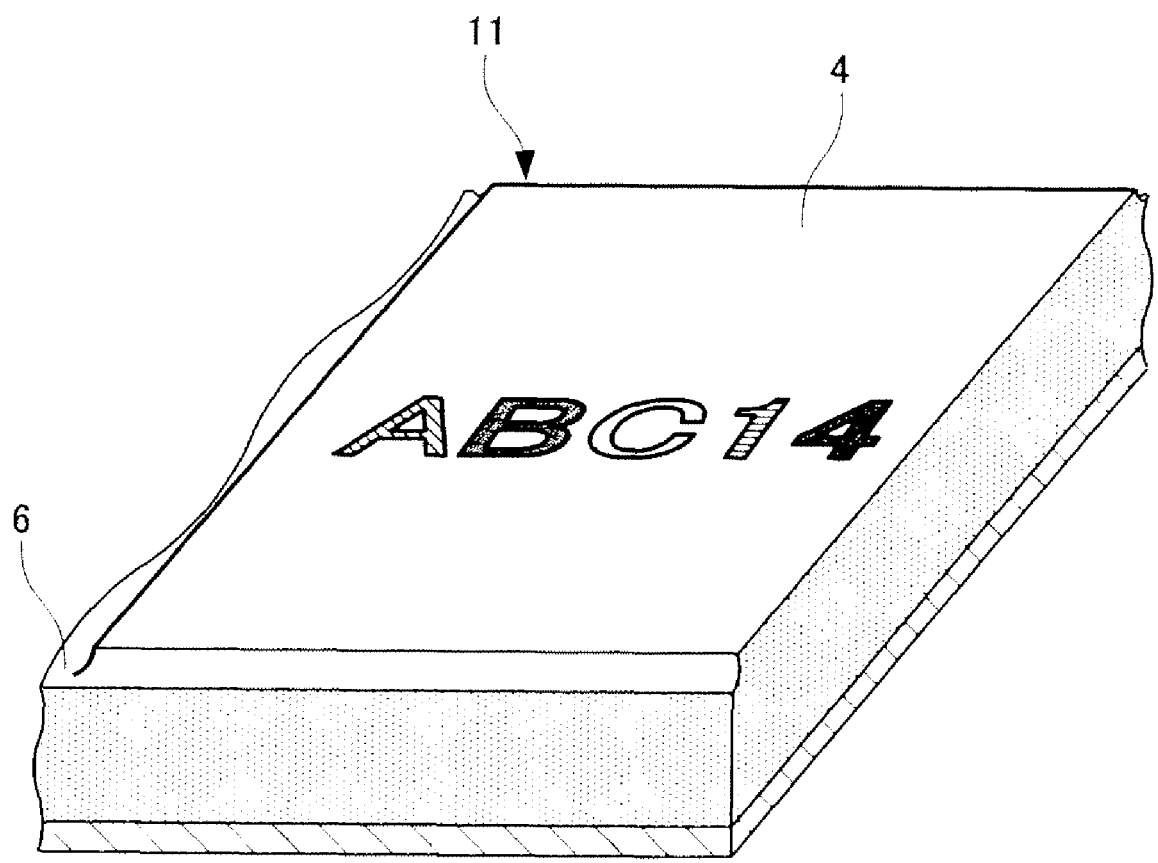
FIG. 12 is a perspective view of a defective unit of the semiconductor device in Embodiment 1 of the invention.

That is, as shown in FIG. 12, when in a defective semiconductor device 11 the dicing position is shifted, corners are cut too much, the external appearance is worsened, and in some cases the thickness of the resin member 3 covering the semiconductor element 2 may be insufficient, so that there are concerns that performance may be rapidly degraded.

However, in such cases, the white continuous depression portion 6, which should exist over the entire outer periphery of the outside surface 4 of the resin member 3 on the semiconductor device 11 is partially interrupted and does not appear on the entire periphery, as shown in FIG. 12.

Hence as shown in FIG. 12, units in which the white continuous depression portion 6 does not continue along the entire outer periphery of the outside surface 4 of the resin member 3 can be discriminated as defective units. When judging whether products are defective or not in this way, satisfactory units have a white continuous depression portion 6, at the edge portion of the outside surface 4 of the resin member 3, that is, the edge portion on the face on the side opposite the face at which the resin member 3 and substrate 1 are in contact, being continuous.

Embodiment 2

Below, the semiconductor device of Embodiment 2 is explained. The basic configuration is similar to that of Embodiment 1; similar constituent components are assigned the same symbols and explanations thereof are omitted. Below, differences are explained.

In the configuration of the above Embodiment 1, as shown in FIG. 8, the continuous depression portions 6 are formed along both sides of the dicing regions, the center portions of the depression portions 6, that are the deepest areas, are positioned slightly shifted to the region inside the boundaries 8 of the dicing regions, the entirety of the depression portions 6 is positioned on the resin members 3 forming the regions of the semiconductor devices 11, and the opening edges of the depression portions 6 are positioned at the boundaries 8 of the dicing regions.

Figure 13:
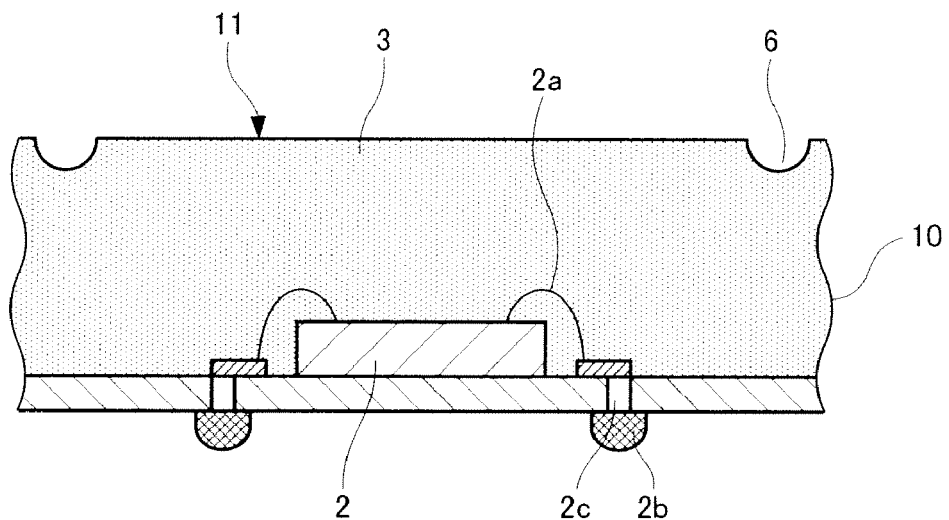
FIG. 13 is a cross-sectional view of a semiconductor device in Embodiment 2 of the invention.
Figure 14:
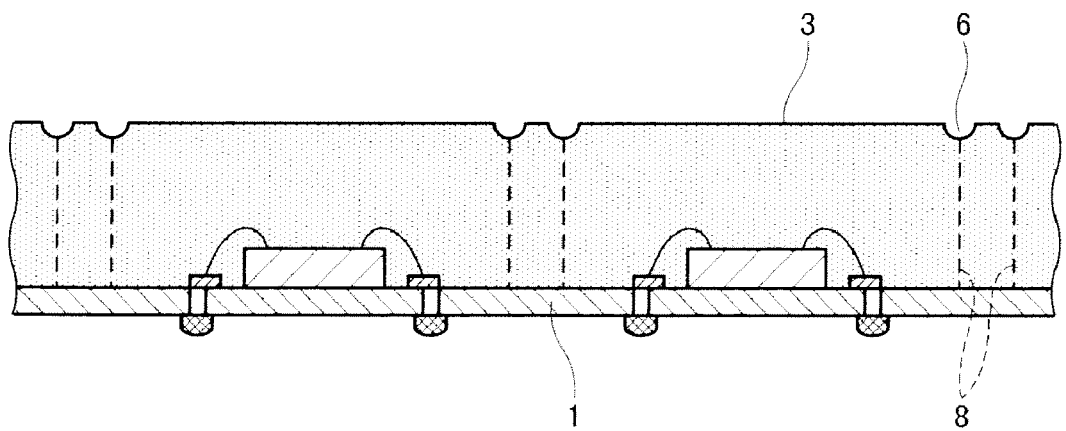
FIG. 14 is a partial enlarged cross-sectional view of a process in a method of manufacture of a semiconductor device in Embodiment 2 of the invention.

However, in Embodiment 2, as shown in FIG. 13 and FIG. 14, continuous depression portions 6 are formed along both sides of the dicing regions, and the center portions of the depression portions 6, that are the deepest areas, are formed at positions coinciding with boundaries 8 of the dicing regions.

Opening edges on both sides of the depression portions 6 are positioned on both sides of the boundaries 8 of the dicing region, and the deepest areas of the depression portions 6 form the outside edges of diced face 10, so that cracking of a resin member 3 forming the region of a semiconductor device 11, on the inside of the continuous depression portions 6, can be more reliably prevented.

Below, a method of manufacture of the semiconductor device 11 is explained. The basic method of manufacture is similar to that in Embodiment 1, an explanation thereof is omitted, and only differences are explained.

In the above Embodiment 1, the configuration was explained in which the outside of the dicing regions, that are the regions through which the dicing blade 9 passes, are irradiated with the laser beam 7.

However, in Embodiment 2, as shown by the dashed lines in FIG. 14, a laser beam 7 irradiates the boundaries 8 of the dicing regions through which a dicing blade 9 passes. The white continuous groove-shape depression portions 6 are formed in an outside surface 4 of the resin member 3 irradiated by the laser beam 7, and the grooves of the depression portions 6 are deepest at the boundaries 8 of the dicing regions.

As a result, the advantageous result that, during dicing, cracking of the resin member 3 forming the region of the semiconductor device 11 on the inside of the continuous depression portions 6 is suppressed, can be more reliably obtained.

Embodiment 3

Below, the semiconductor device of Embodiment 3 is explained. The basic configuration is similar to that of Embodiment 1; similar constituent components are assigned the same symbols and explanations thereof are omitted. Below, differences are explained.

In the configuration of the above Embodiment 1, as shown in FIG. 8, the continuous depression portions 6 are formed along both sides of the dicing regions, the center portions of the depression portions 6, that are the deepest areas, are positioned, slightly further shifted to the inner side of the semiconductor device 11 than the boundaries 8 of the dicing regions, and the opening edges of the depression portions 6 are positioned at the boundaries 8 of the dicing regions.

Figure 15:
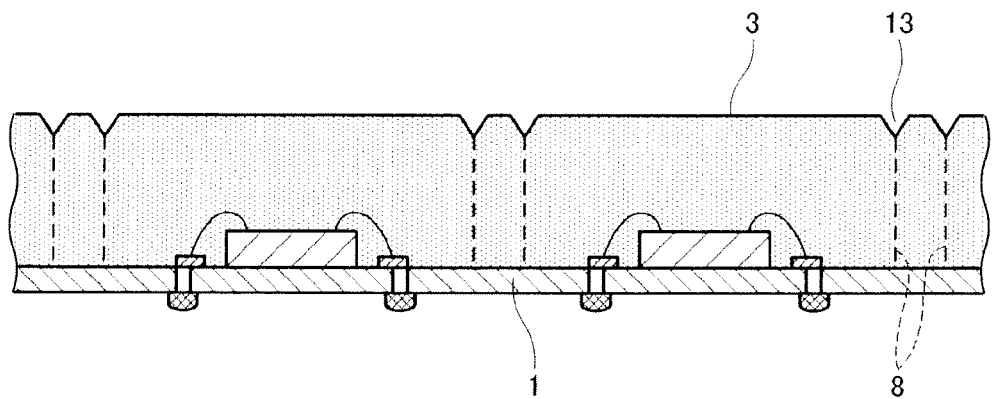
FIG. 15 is a partial enlarged cross-sectional view of a process in a method of manufacture of a semiconductor device in Embodiment 3 of the invention.

However, in Embodiment 3, as shown in FIG. 15, continuous V-shape grooves 13 are formed along both sides of dicing regions in an outside surface 4 of a resin member 3, and the center portions of the V-shape grooves 13, that are the deepest areas, are made to coincide with boundaries 8 of the dicing regions. The V-shape grooves 13 are formed by cutting into the surface of the resin member 3. The V-shape grooves 13 are positioned with opening edges on both sides of the grooves positioned on both sides of the boundaries 8 of the dicing regions, and the deepest areas of the V-shape grooves 13 form the outside edges of diced faces 10, so that cracking of the resin member 3 forming the region of a semiconductor device 11 on the inside of the continuous V-shape grooves 13 can be more reliably prevented.

Below, a method of manufacture of the semiconductor device 11 is explained. The basic method of manufacture is similar to that in Embodiment 1, an explanation thereof is omitted, and only differences are explained.

As shown in FIG. 15, in Embodiment 3, instead of forming the depression portions 6 using the laser beam 7 as in the above Embodiments 1 and 2, a sharp blade is moved to form the V-shape grooves 13 in the outside surface 4 of the resin member 3.

Instead of moving a sharp blade to form the V-shape grooves 13, a V-shape object may be heated and then pressed against the resin member 3 to melt the surface of the resin member 3 and form the V-shape grooves 13.

Or, instead of moving a sharp blade to form the V-shape grooves 13, a chemical that dissolves the resin member 3 may be affixed to the surface of the resin member 3 to form depression-shape grooves.

Embodiment 4

Below, the method of manufacture of the semiconductor device of Embodiment 4 is explained. The basic manufacturing method is similar to that in Embodiment 1, so an explanation thereof is omitted, and only differences are explained.

Figure 16:
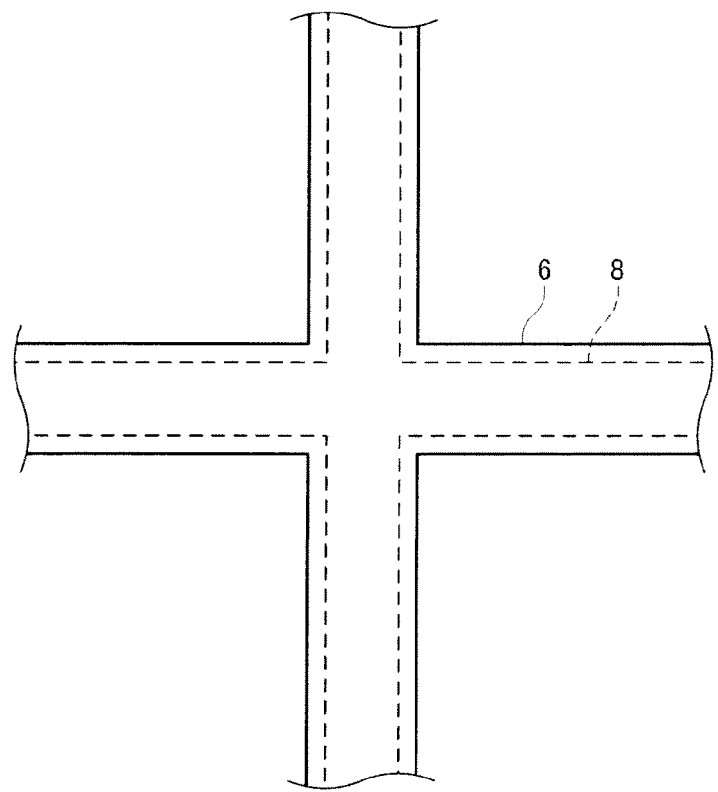
FIG. 16 is a partial enlarged cross-sectional view of a process in a method of manufacture of a semiconductor device in Embodiment 4 of the invention.

FIG. 16 is a partial top view of semiconductor devices 11 prior to division in Embodiment 4. In FIG. 16, dashed lines indicate boundaries 8 of dicing regions in which dicing is to be performed, and solid lines indicate continuous depression portions 6 formed after irradiation with a laser beam 7.

In Embodiment 4, the continuous depression portions 6 are formed along both sides of the dicing regions, and are positioned on a resin member 3 forming the regions of the semiconductor devices 11 on the inside of the boundaries 8 of the dicing regions, but do not exist in the dicing regions.

In this configuration, the continuous depression portions 6 are formed avoiding regions which are to be cut away by dicing, so that there is no need to irradiate portions in dicing regions, in which semiconductor devices 11 that are products do not exist, with the laser beam 7 to form depression portions 6; by adjusting the output of the laser beam 7 used to form the depression portions 6 and other means, the energy and time required can be reduced.

Embodiment 5

Below, the semiconductor device of Embodiment 5 is explained. The basic configuration is similar to that of Embodiment 1; similar constituent components are assigned the same symbols and explanations thereof are omitted. Below, differences are explained.

In the configuration of the above Embodiment 1, as shown in FIG. 8, the continuous depression portions 6 are formed along the entire periphery of the edge portion of the outside surface 4 of the resin member 3 in the semiconductor device 11.

Figure 17:
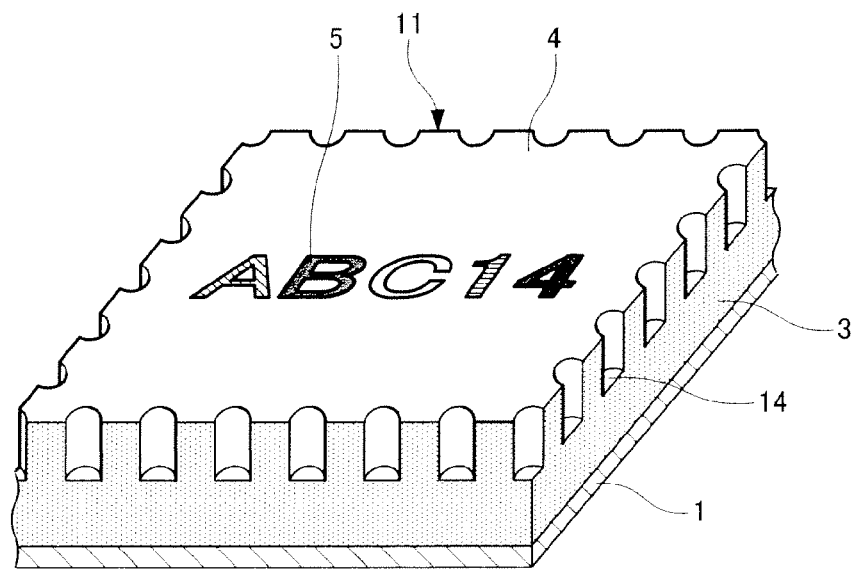
FIG. 17 is a perspective view of a semiconductor device in Embodiment 5 of the invention.

However, in Embodiment 5, as shown in FIG. 17, intermittent depression portions 14 are formed at the edge portions of an outside surface 4 of a resin member 3. Even when the intermittent depression portions 14 are provided at the edge portions of the outside surface 4 of the resin member 3, cracking of the resin member 3 forming the region of a semiconductor device 11 on the inside of the intermittent depression portions 14 can be suppressed.

Below, a method of manufacture of the semiconductor device of Embodiment 5 is explained. The basic method of manufacture is similar to that in Embodiment 1, an explanation thereof is omitted, and only differences are explained.

In the configuration of Embodiment 1, the laser beam 7 is used in continuous irradiation, while changing the irradiation position on the outside surface 4 of the resin member 3.

Figure 18:
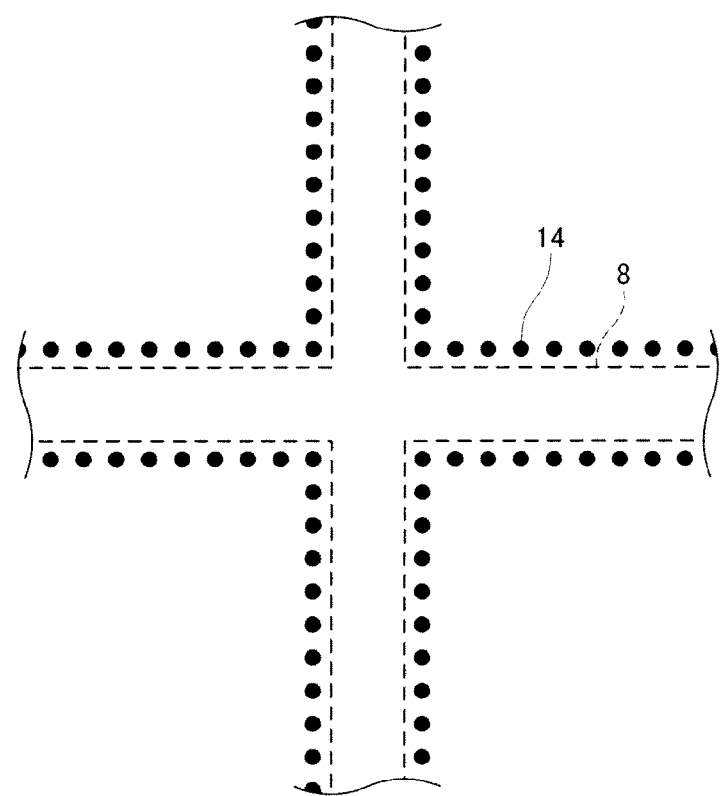
FIG. 18 is a partial enlarged top view of a process in a method of manufacture of a semiconductor device in Embodiment 5 of the invention.

However, in Embodiment 5, as shown in FIG. 18, the irradiation position is not moved when a laser beam 7 irradiates the outside surface 4 of the resin member 3, but instead irradiation by the laser beam 7 is performed for a prescribed time in a state in which the irradiation position is fixed, and thereafter, with the irradiation by the laser beam 7 halted, the irradiation position is changed, and the outer surface 4 of the resin member 3 is again irradiated with the laser beam 7; by repeating this process, the intermittent depression portions 14 are formed in the outer surface 4 of the resin member 3. These intermittent depression portions 14 appear as white dotted lines. However, in FIG. 18, for reasons related to the drawing, the depression portions 14 are shown as black dots.

When, similarly to the first aspect, the same laser beam 7 as that used to form the intermittent depression portions 14 is used to form characters 5 of a unit number, the surfaces of the unit number characters 5 and the intermittent depression portions 14 are the same white color.

As explained above, the manufactured semiconductor device 11 has the white dotted-line-shape intermittent depression portions 14 at the edge portions of the outside surface 4 of the resin member 3, that is, the edge portions on the face opposite the face at which the resin member 3 and a substrate 1 are in contact. Hence similarly to the first aspect, a method for discriminating defective units can be used that employs the white dotted-line-shape intermittent depression portions 14 as an indicator, so that a unit discriminated as non-defective has the intermittent depression portions 14 formed along the entire periphery of the edge portion of the outside surface 4 of the resin member 3.

Embodiment 6

Below, the semiconductor device of Embodiment 6 is explained. The basic configuration is similar to that of Embodiment 1; similar constituent components are assigned the same symbols and explanations thereof are omitted. Below, differences are explained.

In the configuration of the above Embodiment 1, as shown in FIG. 8, the continuous depression portions 6 are formed along the entire periphery of the edge portion of the outside surface 4 of the resin member 3 in the semiconductor device 11.

Figure 19:
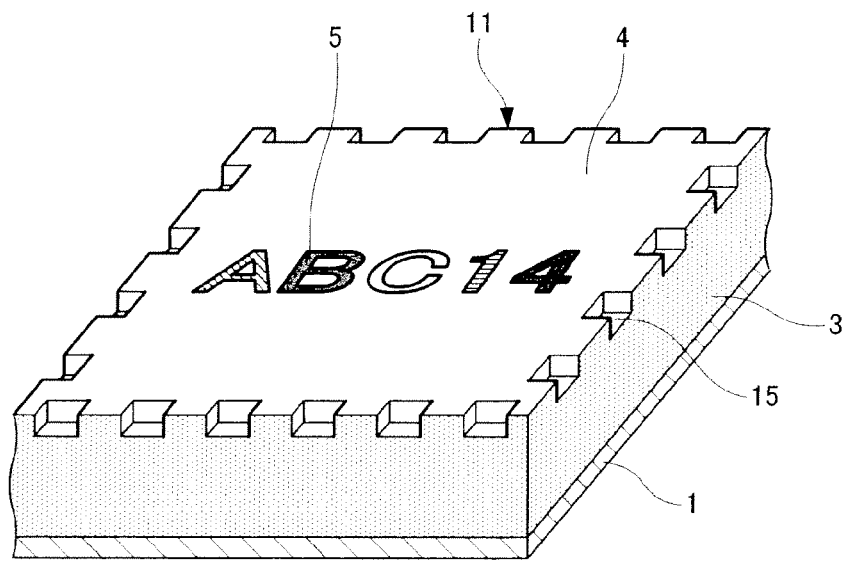
FIG. 19 is a perspective view of a semiconductor device in Embodiment 6 of the invention.

However, in Embodiment 6, as shown in FIG. 19, intermittent depression portions 15 are formed along the entire periphery of the outer edge in an outside surface 4 of a resin member 3. In Embodiment 5, the intermittent depression portions 14 comprised part of a plurality of holes with a shape similar to a cylindrical shape; in Embodiment 6, the intermittent depression portions 15 comprise a plurality of rectangular holes.

When the intermittent rectangular depression portions 15 are provided in this way along the outer edge of the outside surface 4 of the resin member 3, cracking of the resin member 3 forming the region of a semiconductor device 11 on the inside of the intermittent rectangular depression portions 15 can be suppressed.

Below, a method of manufacture of the semiconductor device of Embodiment 6 is explained. The basic method of manufacture is similar to that in Embodiment 1, an explanation thereof is omitted, and only differences are explained.

In the configuration of Embodiment 1, the laser beam 7 is used in continuous irradiation, while changing the irradiation position on the outside surface 4 of the resin member 3, and irradiation by the laser beam 7 is along the boundaries 8 of the dicing regions.

Figure 20:
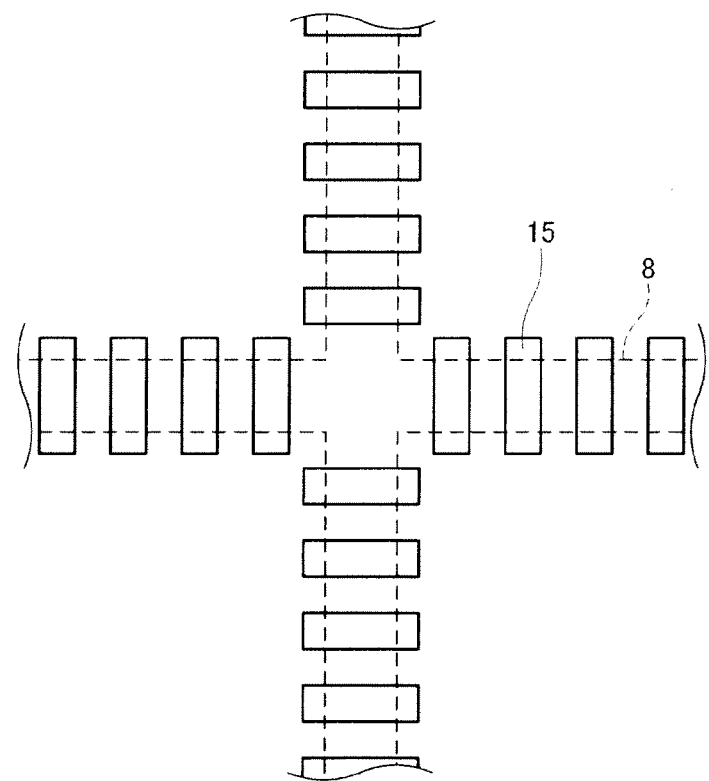
FIG. 20 is a partial enlarged top view of a process in a method of manufacture of a semiconductor device in Embodiment 6 of the invention.

However, in Embodiment 6, as shown in FIG. 20, a laser beam 7 that irradiates the outside surface 4 of the resin member 3 irradiates a rectangular area including the dicing region for a prescribed length of time, and then, with irradiation by the laser beam 7 halted, the irradiation position is changed, and the laser beam 7 again irradiates the outside surface 4 of the resin member 3; by repeating this process, the intermittent rectangular depression portions 15 are formed in the outside surface 4 of the resin member 3.

In this way, even when the intermittent rectangular depression portions 15 are formed in the outside surface 4 of the resin member 3, cracking of the resin member 3 at places distant from the dicing region during dicing can be suppressed, and cracking of the resin member 3 forming the region of a semiconductor device 11 on the inside of the intermittent rectangular depression portions 15 can be suppressed.

Further, similarly to the first aspect, when the same laser beam 7 as that used to form the intermittent rectangular depression portions 15 is used to form unit number characters 5, the surfaces of the unit number characters 5 and of the intermittent rectangular depression portions 15 are the same white color.

The semiconductor device 11 manufactured in this way has the white dotted-line-shape intermittent rectangular depression portions 15 at the edge portions of the outside surface 4 of the resin member 3, that is, the edge portions on the face opposite the face at which the resin member 3 and substrate 1 are in contact. Hence similarly to the first aspect, a method for discriminating defective units can be used that employs the white dotted-line-shape intermittent depression portions 15 as an indicator, so that a unit discriminated as non-defective has the white dotted-line-shape intermittent depression portions 15 formed along the entire periphery of the edge portion of the outside surface 4 of the resin member 3.

Embodiment 7

Below, the semiconductor device manufacturing method of Embodiment 7 is explained. The basic manufacturing method is similar to that of Embodiment 1, so explanations thereof are omitted, and only differences are explained.

In each of the above embodiments, no special treatment was performed in portions where the dicing regions crossed. However, in Embodiment 7, portions equivalent to the portions where the dicing regions cross, and that become the corners of products after cutting and dividing, are irradiated with a laser beam 7 to further lower the heights of the corner portions.

Figure 21:
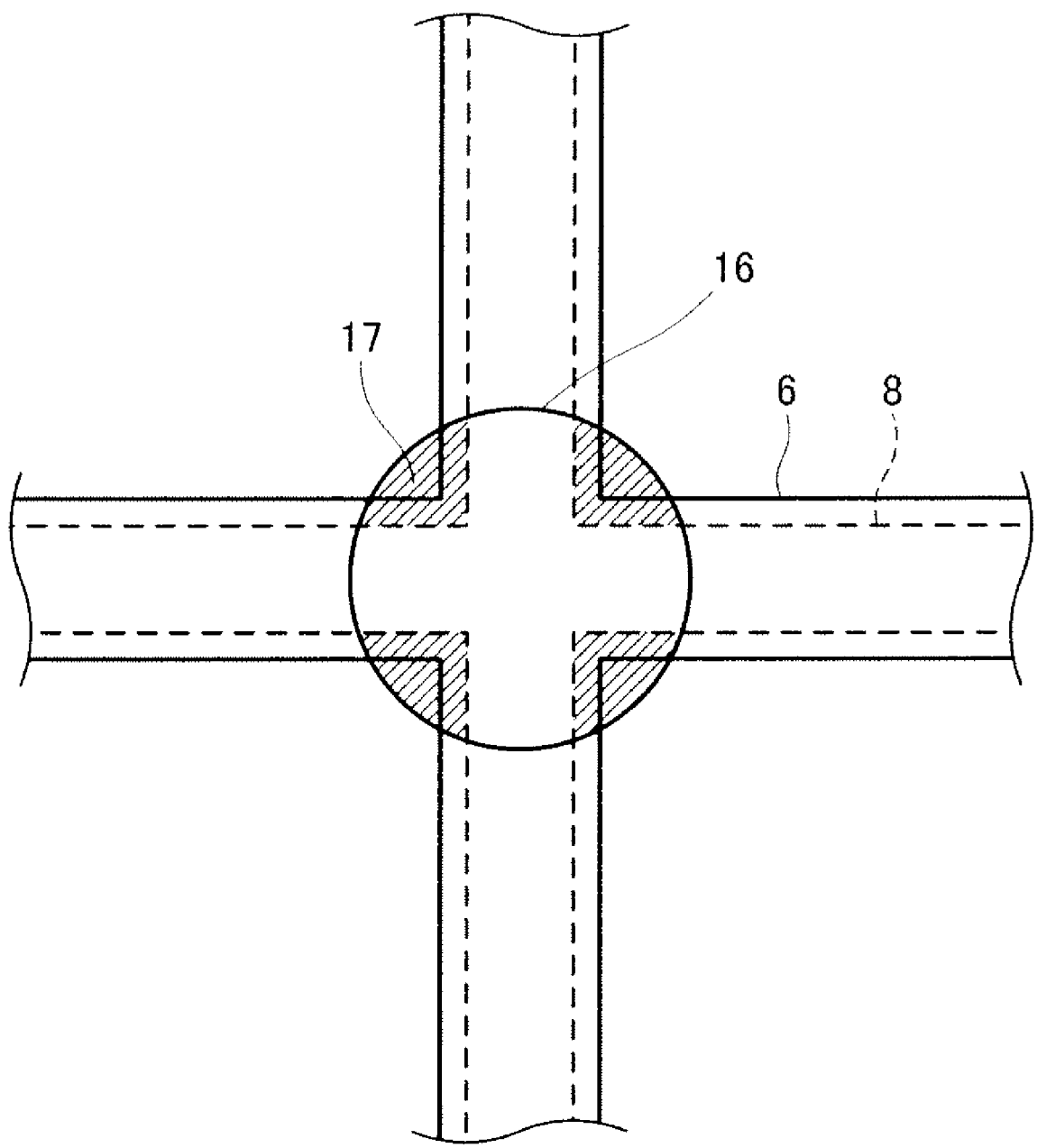
FIG. 21 is a partial enlarged top view of a process in a method of manufacture of a semiconductor device in Embodiment 7 of the invention.

As shown in FIG. 21, after irradiating with the laser beam 7 along boundaries 8 of the dicing regions to form continuous depression portions 6, the laser beam 7 is used for irradiation a plurality of times, in ranges indicated by a circle 16 with a prescribed radius in FIG. 21, portions at which the dicing regions cross and that moreover become corners 17 of semiconductor devices 11 of products after cutting and dividing.

In this way, the laser beam 7 irradiates the portions that become the corners 17 of products after cutting and dividing, and by lowering the portions of the corners 17 of the semiconductor devices 11, cracking of a resin member 3 in portions distant from the dicing regions, near the corners 17 that are most prone to cracking during dicing, can be suppressed.

Embodiment 8

Below, the method of manufacture of a semiconductor device of Embodiment 8 is explained. The basic manufacturing method is similar to that of Embodiment 1, so explanations thereof are omitted, and only differences are explained.

Figure 22:
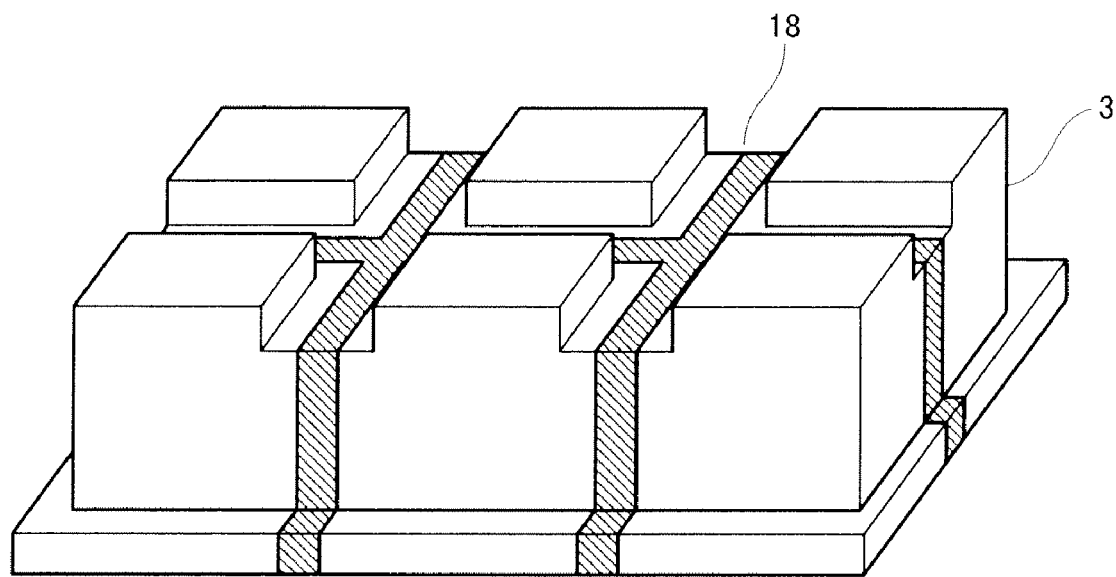
FIG. 22 is a partial enlarged top view of a process in a method of manufacture of a semiconductor device in Embodiment 8 of the invention.

In each of the above embodiments, after forming the resin member 3, the depression portions were formed. However, in Embodiment 8, depression portions 18 with a rectangular cross-section are formed simultaneously with formation of a resin member 3, as shown in FIG. 22. That is, merely by using a die to form the resin member 3, the depression portions 18 including dicing regions as indicated by diagonal lines in FIG. 22, are simultaneously formed. In this way also, cracking of the resin member 3 in places other than the depression portions 18 can be suppressed.

Figure 23:
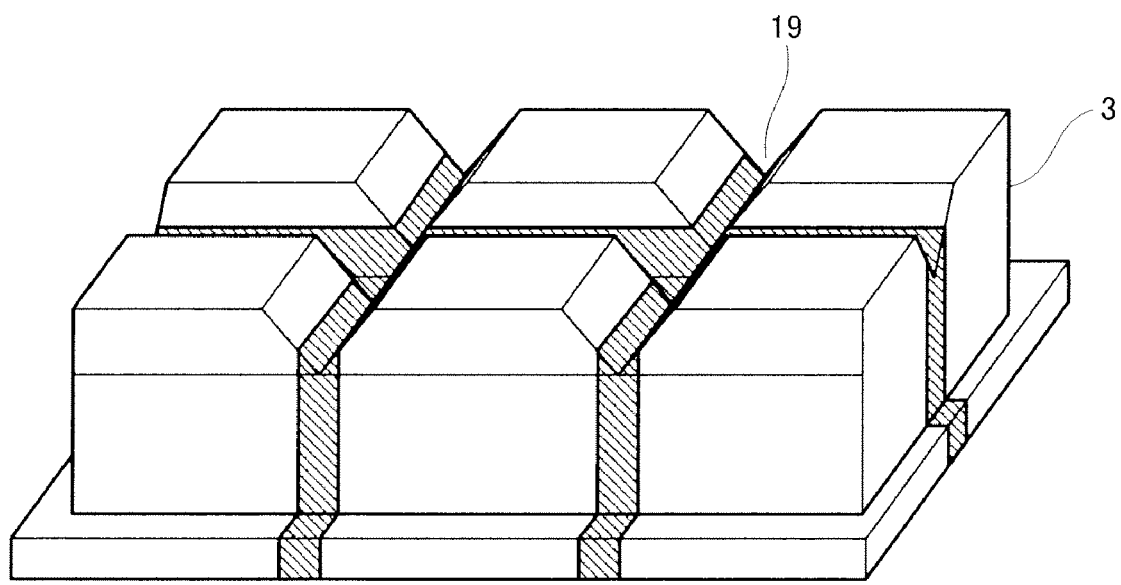
FIG. 23 is a partial enlarged perspective view of a process of another method of manufacture of a semiconductor device in Embodiment 8 of the invention.

As shown in FIG. 23, when the resin member 3 is formed, at the same time a die may be used to form depression portions 19 with a V-shape cross-section. By this means, because the depression portions 19 are V-shape, the die can easily be removed.

In each of the above embodiments, cases were explained in which the semiconductor elements 2 are protected by the resin member 3; however, the invention is not limited to such semiconductor elements, and the occurrence of defective units can similarly be suppressed in cases where components the performance of which may be degraded due to oxidization upon contact with air, components that may malfunction when dust adheres or external forces are applied, or the like are covered by a resin member 3 for purposes of protection.

Also, in each of the above embodiments, a wire bonding configuration was described; but this invention is not limited to wire bonding, and can also be achieved in a configuration employing flip-chip connection.

The semiconductor devices and semiconductor device manufacturing methods of this invention can be utilized to suppress the occurrence of defective semiconductor device units.

What is claimed is:

1. A semiconductor device, comprising:
   a substrate having a first surface and a second surface opposite the first surface;
   a semiconductor element on the first surface of the substrate;
   a mold resin encapsulating the first surface of the substrate and the semiconductor element, having a top surface opposite a surface contacting the first surface of the substrate,
   a recess in the mold resin continuously forming edge portions of the top surface of the mold resin, wherein the recess also extends laterally continuously to the side surface of the mold resin; and
   a side surface of the mold resin is in substantially the same plane as a side surface of the substrate in cross-sectional view.

2. A semiconductor device, comprising:
   a substrate having a first surface and a second surface opposite the first surface;
   a semiconductor element mounted on the first surface of the substrate;
   a mold resin encapsulating the first surface of the substrate and the semiconductor element, having a top surface opposite a surface contacting the first surface of the substrate, recesses in the mold resin intermittently forming edge portions of the top surface of the mold resin, wherein the intermittent recesses extend laterally to the side surface of the mold resin; and
   a side surface of the mold resin is in substantially the same plane as a side surface of the substrate in cross-sectional view.

3. The semiconductor device according to claim 1, having symbol-shaped depressions in the top surface of the mold resin.

4. The semiconductor device according to claim 2, having symbol-shaped depressions in the top surface of the mold resin.

5. The semiconductor device according to claim 3, wherein the symbol-shaped depressions and the recess are the same color.

6. The semiconductor device according to claim 4, wherein the symbol-shaped depressions and the recess are the same color.

7. The semiconductor device according to claim 1, wherein the recess is a white color.

8. The semiconductor device according to claim 2, wherein the recess is a white color.

9. The semiconductor device according to claim 1, wherein the recess is along the entire edge portions of the top surface of the mold resin.

10. The semiconductor device according to claim 2, wherein the intermittent recesses are along the entire edge portions of the top surface of the mold resin.

11. The semiconductor device according to claim 1, further comprising:
    a plurality of electrodes on a top surface of the semiconductor element opposite a surface connected to the first surface of the substrate;
    a plurality of internal terminals on the first surface of the substrate;
    a plurality of bonding members connecting the electrodes of the semiconductor element and the internal terminals of the substrate; and
    a plurality of external terminals on the second surface,
    wherein the mold resin encapsulates the electrodes, the internal terminals and the bonding members.

12. The semiconductor device according to claim 11, wherein
    the internal electrodes on the first surface of the substrate and the plurality of external terminals on the second surface of the substrate are electrically connected via through-holes in the substrate.

13. The semiconductor device according to claim 1, wherein a center of the mold resin overlaps the semiconductor element in cross-sectional view.

14. The semiconductor device according to claim 2, wherein a center of the mold resin overlaps the semiconductor element in cross-sectional view.

* * * * *